United States Patent
Jamneala et al.

(10) Patent No.: US 7,107,170 B2
(45) Date of Patent: Sep. 12, 2006

(54) MULTIPORT NETWORK ANALYZER CALIBRATION EMPLOYING RECIPROCITY OF A DEVICE

(75) Inventors: Tiberiu Jamneala, San Francisco, CA (US); Burhan Zaini, Kedah (MY); David A. Feld, Newark, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 100 days.

(21) Appl. No.: 10/758,435

(22) Filed: Jan. 14, 2004

(65) Prior Publication Data

US 2004/0162689 A1    Aug. 19, 2004

Related U.S. Application Data

(63) Continuation-in-part of application No. 10/368,179, filed on Feb. 18, 2003, now Pat. No. 7,064,555.

(51) Int. Cl.
*G06F 19/00* (2006.01)

(52) U.S. Cl. .................. 702/107; 702/85; 702/189; 324/601; 324/638; 438/179

(58) Field of Classification Search .................. 702/85, 702/104, 182, 186, 189, 107; 324/601, 638; 438/179
See application file for complete search history.

(56) References Cited

U.S. PATENT DOCUMENTS

| | | | |
|---|---|---|---|
| 4,808,913 A * | 2/1989 | Grace | 324/638 |
| 4,982,164 A | 1/1991 | Schiek et al. | |
| 5,666,059 A | 9/1997 | Heuermann et al. | |
| 5,715,183 A | 2/1998 | Grace et al. | |
| 5,748,506 A | 5/1998 | Bockelman | |
| 6,041,077 A * | 3/2000 | Clark et al. | 375/224 |
| 6,060,888 A | 5/2000 | Blackham et al. | |
| 6,081,125 A | 6/2000 | Krekels et al. | |
| 6,606,583 B1 * | 8/2003 | Sternberg et al. | 702/191 |
| 6,643,597 B1 | 11/2003 | Dunsmore | |
| 6,647,357 B1 * | 11/2003 | Conte | 702/189 |
| 6,850,076 B1 * | 2/2005 | Tsironis | 324/637 |

OTHER PUBLICATIONS

Ferrero et al., 'Comparison Between a Vector Multi-Port Network Analyzer and the National S-Parameter Measurement System', Jan. 1995, IEEE Article, pp. 143-144.*

(Continued)

*Primary Examiner*—Marc S. Hoff
*Assistant Examiner*—Elias Desta

(57) ABSTRACT

A multiport vector network analyzer calibration employs measurements of an asymmetric reciprocal device to determine a value of a defining parameter of a calibration standard in a set of calibration standards. A method of determining a parameter value determines and reports the parameter value. A method of compensating a calibration determines the parameter value and employs the determined parameter value to optimize a set of error coefficients of an error model of the multiport vector network analyzer. A multiport vector network analyzer that includes a controller, a test set, and computer program executed by the controller, compensates a calibration using the determined parameter value and a set of optimized error coefficients. A calibration compensation system that includes a multiport vector network analyzer, a computer, and a computer program executed by the computer, determines and reports the parameter value.

35 Claims, 6 Drawing Sheets

OTHER PUBLICATIONS

Bockelman et al., 'Calibration and Verification of the Pure-Mode Vector Network Analyzer', 1998, IEEE Article, vol. 46, No. 7, pp. 1009-1012.*

Wiatr et al., 'Simultaneous Noise and Vector Network Analysis Using Radiometer Systems', Jan. 1999, IEEE Article, pp. 198-229.*

Coren, 'Reciprocity in EMI-EMC', 1991, IEEE Publication, pp. 184-188.*

Randa, 'Noise Characterization of Multiport Amplifiers', Oct. 2001, IEEE Publicaiton, vol. 49, No. 10, pp. 1757-1763.*

Andrea Ferrero, "Two-port Network Analyzer Calibration Using an Unknown "Thru"," IEEE Microwave and Guided Wave Letters, col. 2, No. 12, Dec. 1992, pp. 505-507.

PN 85105B, "Specifying Calibration Standards for the Agilent 8510 Network Analyzer", Agilent Technologies, Inc., Sep. 21, 2001, 5956-4352, pp. 1-32.

AN 1287-3, "Applying Error Correction to Network Analyzer Measurements", Agilent Technologies, Inc., Mar. 27, 2002, 5965-7709E, pp. 1-16.

AN 1287-9, "In-Fixture Measurement Using Vector Network Analyzers", Agilent Technologies, Inc. 1999, 5968-5329E, pp. 1-32.

"Agilent Test Solutions for Multiport and Balanced Devices", Agilent Technologies, Inc., May 11, 2001, 5988-2461EN, pp. 1-8.

* cited by examiner

US 7,107,170 B2

MULTIPORT NETWORK ANALYZER CALIBRATION EMPLOYING RECIPROCITY OF A DEVICE

RELATED APPLICATIONS

This application is a continuation-in-part of U.S. patent application Ser. No. 10/368,179, filed Feb. 18, 2003, now U.S. Pat. No. 7,064,555 the disclosure of which is incorporated herein by reference.

BACKGROUND

1. Technical Field

The invention relates to electronic test and measurement equipment. In particular, the present invention relates to calibration of electronic test and measurement equipment such as vector network analyzers.

2. Description of Related Art

A vector network analyzer (VNA) measures a performance of a radio frequency (RF) and/or microwave/millimeter wave device under test (DUT) and produces measured results in terms of network scattering parameters. As with all test and measurement equipment, VNAs introduce errors into measured S-parameter data produced for a given DUT. The presence of these errors distorts or corrupts the measurements of actual S-parameter data for the DUT.

Fortunately, the effects of at least the so-called 'systematic' errors introduced by the VNA and any associated test system (e.g., cables, connectors, fixture, etc) may be characterized and subsequently removed from measurements of the DUT through VNA calibration. Unfortunately, it is not always convenient or even possible, in many cases, to construct and/or characterize a set of calibration standards, the defining parameters of which are known with sufficient accuracy for calibration purposes over a frequency range of interest. Moreover, even in cases where it is possible to manufacture precision standards, the calibration standards may be very expensive owing to a need to control and accurately characterize the performance of such standards.

Accordingly, it would be advantageous to calibrate a VNA without relying on using a set of calibration standards having accurately known characteristics. Such a calibration would solve a long-standing need in the area of calibrating a VNA using calibration standards.

BRIEF SUMMARY

In an embodiment of the present invention, a method of determining a parameter value for a set of calibration standards used to calibrate a multiport vector network analyzer is provided. In some embodiments, the method comprises employing measurements of an asymmetric reciprocal device. The asymmetric reciprocal device measurements are made with the multiport vector network analyzer. The measurements are employed to optimize a parameter value of a defining parameter of the set of calibration standards.

In another embodiment of the invention, a method of compensating a calibration of a multiport vector network analyzer having more than two test ports is provided. In some embodiments, the method comprises optimizing error coefficients of an error model of the multiport vector network analyzer using measurements of an asymmetric reciprocal device. According to the method, the calibration is compensated to minimize effects of a poorly known defining parameter of a set of calibration standards used for the calibration.

In yet another embodiment of the invention, a multiport VNA is provided. In some embodiments, the multiport vector network analyzer comprises a calibration compensator comprising a measurement of an asymmetric reciprocal device. The calibration compensator compensates for inaccuracies in knowledge of a parameter value of a calibration standard in a set of calibration standards. The set of calibration standards is used to calibrate the multiport vector network analyzer.

In still yet another embodiment of the invention, a calibration compensation system is provided. In some embodiments the calibration compensation system comprises a computer, a multiport vector network analyzer, and a computer program stored in a memory, the computer program being executed by the computer. The computer program comprises instructions that control the multiport vector network analyzer and implement determining a parameter value of a defining parameter of a calibration standard in a set of calibration standards using a measurement of an asymmetric reciprocal device.

Certain embodiments of the present invention have other features in addition to and in lieu of the features described hereinabove. These and other features of the invention are detailed below with reference to the following drawings.

BRIEF DESCRIPTION OF THE DRAWINGS

The features of various embodiments of the present invention may be more readily understood with reference to the following detailed description taken in conjunction with the accompanying drawings, where like reference numerals designate like structural elements, and in which.

DETAILED DESCRIPTION

Various embodiments of present invention facilitate a calibration of a multiport vector network analyzer (VNA) using calibration standards. Some embodiments of the present invention employ measurements of an asymmetric reciprocal device to correct for inaccurately known defining parameters of the calibration standards used for multiport VNA calibration. Using such measurements of the asymmetric reciprocal device, values of the defining characteristics or parameters of the calibration standards are adjusted until essentially optimized. As a result, calibration standards having poorly known or inadequately characterized parameters may be employed to calibrate the multiport VNA to a degree and level of accuracy normally associated with known or precision calibration standards. Moreover, embodiments of the present invention facilitate the characterization of poorly known calibration standards enabling such standards to be essentially treated and employed as 'precision' standards.

Figure 1:
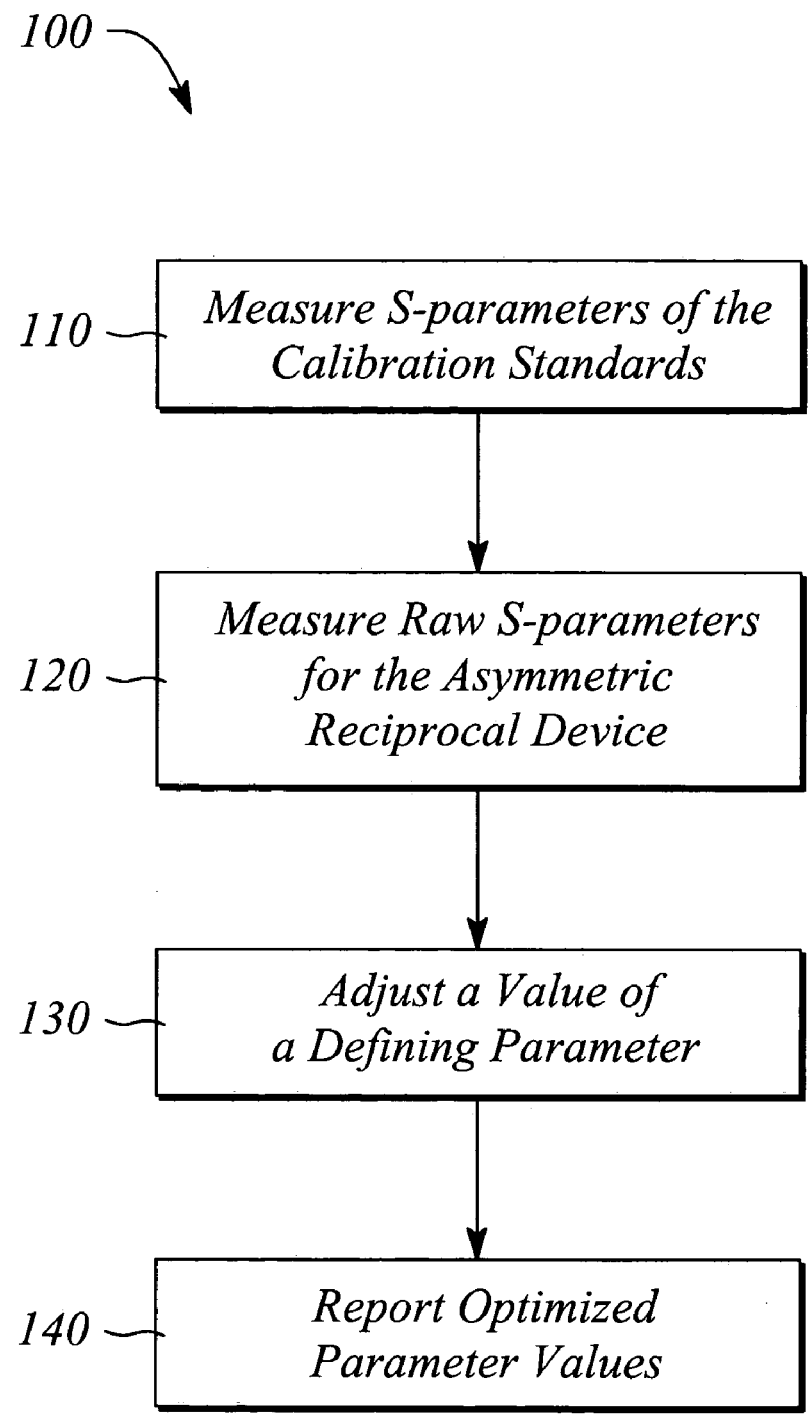
FIG. 1 illustrates a flow chart of a method of determining a parameter value of a defining parameter of a set of calibration standards used to calibrate a multiport vector network analyzer (VNA) according to an embodiment of the present invention.

FIG. 1 illustrates a flow chart of a method of determining a parameter value of a defining parameter of a set of calibration standards used to calibrate a multiport vector network analyzer (VNA) according to an embodiment of the present invention. The method 100 of determining determines the parameter value by adjusting the parameter value to essentially minimize a difference between a corrected measured forward transmission S-parameter and a corrected measured reverse transmission S-parameter of an asymmetric reciprocal device. In some embodiments, the method 100 of determining employs a root mean square (rms) difference between the corrected measurements of a forward transmission S-parameter and a reverse transmission S-parameter of the asymmetric reciprocal device at various frequencies of interest as an optimization metric to produce an optimized parameter value. Furthermore, in some embodiments, a multiport asymmetrical reciprocal device is employed.

Once determined, the set of calibration standards having the optimized parameter value may be employed to make calibrated measurements of a device under test (DUT). The method 100 of determining a parameter value may be used to simultaneously determine parameter values of more than one defining parameter of the set of calibration standards. In other embodiments, defining parameters are determined for all but a single thru standard. By determining the parameter value or values, the method 100 facilitates using one or more calibration standards having one or more unknown or poorly known defining parameters when performing a multiport VNA calibration.

Herein, 'a' and 'an' mean 'one or more', such that one or more parameter value(s) of a respective one or more 'unknown' or 'poorly known' defining parameter(s) of one or more calibration standard(s) in a set of calibration standards are determined. Furthermore as used herein, a 'defining parameter' is a parameter of a calibration standard that is employed, either directly or indirectly, in determining a set of error coefficients associated with an error model of the multiport VNA from measurements of the calibration standard. Moreover as used herein, an 'unknown' or 'poorly known' parameter is a parameter having a value that is either completely unknown or is not known with sufficient accuracy over a frequency range of interest to support a desired error correction of the calibration using conventional calibration methods. An 'asymmetric' device is any device for which a reflection S-parameter $S_{nn}$ of an n-th port (e.g., port-n) is different in one or both of a magnitude and a phase from a reflection S-parameter of a an m-th port (e.g., port-m) in at least a portion of a frequency range or band of interest. For example, a particular device having a reflection S-parameter $S_{11}$ at port-1 that is not equal to a reflection S-parameter $S_{22}$ at port-2 in at least some portion of the frequency range of interest is an asymmetric device.

Herein, a multiport VNA is a VNA having more than two test ports. Alternatively, the multiport VNA may be a two-port VNA in combination with an S-parameter test set that increases a number of available test ports to more than two. Similarly, the multiport VNA may be a multiport VNA such as, but not limited to, a three-port VNA or a four-port VNA in combination with a parameter test set that increases the number of available test ports. Thus, a VNA having two ports combined with an S-parameter test set such that the combination yields more than two test ports is a multiport VNA. Moreover, a VNA having three, four, five, six or more test ports are all examples of a multiport VNA, with or without an S-parameter test set that expands the number of test ports.

For example, the multiport VNA may be a model E5071B-413 four-port VNA manufactured by Agilent Technologies, Palo Alto, Calif. In another example, the multiport VNA is an Agilent Technologies, Inc., Model 8720ES VNA with a N4418A S-parameter test set. The combination of the 8720ES VNA and the N4418A S-parameter test set provides a 4-port multiport VNA with full 4-port error correction. In another example, the multiport VNA may be a model E5071B-413 four-port VNA manufactured by Agilent Technologies, Palo Alto, Calif. also with a N4418A S-parameter test set. Further additional examples of multiport VNA configurations may be found in "Agilent Test Solutions for Multiport and Balanced Devices," Literature Number 5988-2461EN, Agilent Technologies, Inc., incorporated herein by reference.

Network scattering parameters, more commonly known as 'S-parameters', are transmission and reflection (T/R) coefficients for a device under test (DUT) computed from measurements of voltage waves traveling toward and away from a port or ports of the DUT. In general, an S-parameter is expressed either in terms of a magnitude and phase or in an equivalent form as a complex number, the complex number having a real part and an imaginary part. A set of $N^2$ such S-parameters, namely $S_{nn}$, $S_{nm}$, and $S_{mn}$, where each of n and m=1, 2, ..., N, n not being equal to m, and each of n and m being represented by a complex number, provide a complete characterization of linear RF performance of a given multiport DUT at a single frequency. A series or sequence of S-parameters, each member of the sequence having been measured at one of multiple different frequencies across an operational frequency range of the DUT, characterizes a frequency performance of the DUT.

A calibration of a multiport VNA involves measuring S-parameters of a set of specialized devices known as 'calibration standards' using the VNA being calibrated. For example, a set of twelve calibration standards is generally used to calibrate a three port VNA. In some cases, especially when employing a symmetric test fixture, the set of calibration standards may only use six independent standards.

A set of error coefficients for an error model of the multiport VNA is then computed from the measured S-parameters using known values of certain defining parameters of the calibration standards. Once computed, the error coefficients may be used to apply a correction to 'raw' or 'as measured' S-parameter data produced by the multiport VNA for the DUT. The correction so applied mathematically to the data essentially removes the effects of the systematic errors from the raw S-parameter data yielding 'error corrected' or 'calibrated' measured S-parameter data for the DUT. Thus, the calibrated or error corrected data for the DUT generally represents, or is interpreted as being, an accurate indication of an 'actual' performance for the DUT independent of the VNA.

A calibration standard having an unknown or poorly known defining parameter is referred to herein as an 'unknown' or 'non-precision' calibration standard. For example, an unknown calibration standard may be one developed for in situ testing of a DUT that is mounted in a printed circuit board (PCB) or a text fixture. In some embodiments, the unknown calibration standard approximates one type of a known or precision standard used in a conventional standards-based calibration. An operational range of the DUT and/or of the standard typically defines the frequency range of interest. The method 100 of determining a parameter value may involve a broader frequency range than the frequency range of interest for the DUT to provide for a desired or an adequate calibration of the multiport VNA, according to some embodiments. One of ordinary skill in the art can readily determine a frequency range for the method 100 of determining a parameter value given a frequency range of interest of the DUT without undue experimentation.

Conversely, a 'known' or a 'precision' calibration standard is a calibration standard having known defining parameters. In particular, a precision standard is a standard for which a parameter value of each defining parameter of the calibration standard is know with sufficient accuracy and precision to support a calibration of the VNA. Often, precision calibration standards have parameter values provided by and guaranteed by a manufacturer of the calibration standard. Alternatively, defining parameter values for a particular precision standard may be measured, either directly or indirectly, by one of several known methods after the calibration standard is constructed and prior to its use as a precision standard for calibration purposes.

A measured characteristic may be either 'raw' measured characteristics or 'corrected' measured characteristics. As used herein, the term 'raw' indicates that the measured characteristic is uncorrected and generally includes systematic errors associated with the measurement system. Also as used herein, the term 'corrected' generally refers to a measured characteristic to which a correction has been applied. In some cases, a corrected measurement may be referred to as a 'calibrated' measurement to indicate that the measurement was made using a calibrated system. Typically, an error model-based correction is used in multiport VNA measurements to generate corrected or calibrated measurements from raw measurements of S-parameters of a device.

In general, when using precision or known calibration standards having accurately known parameter values for the defining parameters, the correction applied to generate a corrected or calibrated measurement reduces or essentially eliminates the effects of the systematic errors of the measurement system. However, when a calibration standard having a poorly known or unknown defining parameter value is employed, the corrected measurement necessarily includes an error component associated with the knowledge or more correctly, the lack of knowledge of the parameter value. In other words, an error in a parameter value of a defining parameter of the calibration standard introduces an error in the correction applied to produce the corrected measurement.

Thus, herein the term 'calibrated' measurement will be used to refer to a corrected measurement when using precision calibration standards having well-known or well-characterized parameter values. The term 'corrected' measurement will be reserved for measurements that have been corrected using a set of calibration standards where a calibration standard of the set may have a poorly known or inadequately characterized parameter value. Of course, once a parameter value used to produce a corrected measurement becomes known with sufficient accuracy for calibration purposes, the corrected measurement essentially becomes a calibrated measurement. Moreover, the terms 'corrected' and 'error corrected' are used interchangeably hereinbelow. Also, the term 'essentially equals' mean the parameters have the same values or values that are similar.

As is well known in the art, a linear, passive, time reversal symmetric device exhibits reciprocal behavior. Specifically, linear, passive, time reversal symmetric devices will have a set of actual forward transmission S-parameters, namely $S_{nm}$, that equals a corresponding set of actual reverse transmission S-parameters, namely $S_{mn}$. In other words, any reciprocal device having N ports will exhibit reciprocal forward and reverse S-parameters, $S_{nm}$ and $S_{mn}$, such that for each n and m from 1 to N, n not equal to m, $S_{nm}$ equals $S_{mn}$ (e.g., $S_{12}=S_{21}$, $S_{13}=S_{31}$, $S_{23}=S_{32}$ for N=3).

Examples of reciprocal devices include, but are not limited to, low pass filters, high pass filters, bandpass filters, attenuators, diplexer filters, multiplexer filters, and finite length transmission lines. Moreover, one skilled in the art recognizes that the term 'linear', as used herein, includes 'approximately linear', as is well known in the art of linear devices. Many reciprocal devices are also asymmetric reciprocal devices.

An asymmetric reciprocal device may be any asymmetric device having an 'actual' forward transmission S-parameter (e.g., $S_{21}$) that essentially equals an actual reverse transmission S-parameter (e.g., $S_{12}$) in a frequency range of interest. As noted hereinabove, the term 'actual' refers to a true characteristic of a device and is meant to distinguish the characteristic from a 'measured' characteristic that includes errors, both systematic and random, associated with a system (e.g., a multiport VNA) used to perform the measurement.

In some embodiments, the asymmetric reciprocal device is a multiport device having unequal input and output reflection S-parameters as defined hereinabove. In other words, the asymmetric reciprocal device exhibits a difference between an input reflection S-parameter $S_{nn}$ at an n-th port referred to herein as 'port-n' and an input reflection S-parameter $S_{mm}$ at an m-th port referred to herein as 'port-m'. The distinction between port-n and port-m is made for discussion purposes only and in no way limits the present invention. For example where n equals 3 and m equals 4, the n-th port is 'port-3' and the reflection S-parameter is $S_{33}$ while the m-th port is 'port -4' and the reflection S-parameter is $S_{44}$. In another example, where n equals 1 and m equals 3, the n-th port is 'port-1' and the reflection S-parameter is $S_{11}$ while the m-th port is 'port-3' and the reflection S-parameter is $S_{33}$. Thus, the asymmetric reciprocal device is defined by unequal refection S-parameters such that $S_{nn}$ is not equal to $S_{mm}$ for all n not equal to m.

In some embodiments, the difference between the reflection parameters of the asymmetric reciprocal device is a big difference rather than a small difference. In general, the bigger the difference, the better or higher quality are the results according such embodiments. Moreover in some embodiments, the difference in the reflection parameters $S_{nn}$ and $S_{mm}$ is present at least to some extent over an appreciable portion of a frequency range of interest of the DUT. How different the $S_{nn}$ and $S_{mm}$ reflection parameters are and over what portion of the frequency range the difference exists ultimately affect a speed and an accuracy with which a determination 100 of a parameter value is achieved. However, all reciprocal devices exhibiting at least some difference in the reflection parameters $S_{nn}$ and $S_{mm}$ over at least some portion of a frequency range are useful and within the scope of method 100.

For example, a low-loss, narrow bandpass filter having a passband near a lower end of a frequency range of interest is known to exhibit a relatively large difference between reflection parameters $S_{11}$ and $S_{22}$ over much of a frequency range of interest. In particular, the reflection parameters $S_{11}$ and $S_{22}$ of such a bandpass filter are likely to be very different from one another from an upper passband edge of the filter up to a frequency point at which higher order modes tend to compromise a rejection characteristic of such a filter. Thus, this sort of filter is often an ideal choice for use as the asymmetric reciprocal device according to some embodiments of the method 100. On the other hand, an attenuator having a high attenuation level (e.g., 40 dB) is not likely to exhibit much difference between the reflection parameter $S_{11}$ at port-1 and the reflection parameter $S_{22}$ at port-2. Thus, such an attenuator would be less desirable as the asymmetric reciprocal device according to some embodiments. In another example, a multiport asymmetric reciprocal device such as, but not limited to, a multiport duplexer may be employed. From the above-referenced example and employing widely held knowledge of radio frequency (RF) and microwave devices, one skilled in the art can readily identify and select a suitable asymmetric reciprocal device without undue experimentation.

Referring again to FIG. 1, the method 100 of determining a parameter value comprises measuring 110 S-parameters for the standards in a set of calibration standards using the multiport VNA. The S-parameters that are measured 110 are those normally associated with the calibration standards. For example, an input port reflection S-parameter, namely $S_{11}$, is measured 110 for a calibration standard that represents a short circuit. In another example, an input port reflection S-parameter, namely $S_{11}$, is measured 110 for a calibration standard that represents an open circuit. The reflection S-parameters for such open circuit and short circuit calibration standards are measured for each of the test ports of the multiport VNA by temporarily connecting each standard to each of the test ports. Similarly, S-parameters of other standards in the set are measured 110 by temporarily connecting the standards to the test ports of the multiport VNA.

The S-parameters are measured 110 over a range of frequencies that spans a frequency range for which a calibration of the VNA is being performed. In some embodiments, measuring 110 comprises taking discrete S-parameter measurements at a number of frequency points within the frequency range. Additionally in some embodiments, a number of frequency points within the frequency range, at which the S-parameters of the calibration standards are measured, is greater than or equal to a number of parameter values that are determined 100. For example, if there are three parameter values of respective three defining parameters being determined 100, preferably there are at least three frequency points within the frequency range at which the S-parameters of the standards of the set of calibration standards are measured 110. As is consistent with conventional calibration standards measurement during a multiport VNA calibration, an order in which the calibration standards of the set are measured 110 is not important.

In general, a type of calibration being performed with the multiport VNA determines the set of calibration standards and the S-parameter measurements normally associated with each calibration standard of the set. For example, a well-known type of calibration is a so-called 'SOLT' calibration. The set of calibration standards used in an SOLT calibration include a short circuit ('short'), an open circuit ('open'), a load, and a through ('thru'). A reflection S-parameter measurement at each port of an exemplary three-port VNA (e.g., $S_{11}$ at port-1, $S_{22}$ at port-2, and $S_{33}$ at port-3, respectively) is normally associated with the short standard. As such, implicit in measuring 110 are a determination of what type of calibration is to be performed and a choice of a set of calibration standards to be used. In turn, the type of calibration determines the normally associated measurements 110.

The choice of calibration standards is based on conventional guidelines for choosing calibration standards. Conventional guidelines include choosing calibration standards that have S-parameters that are widely spaced apart from each other in the complex S-parameter plane. Often, the determination of calibration type (e.g. SOLT) is dictated by the particular network analyzer being used. A discussion of calibration standards, SOLT calibration methods, and conventional in-fixture calibration are provided in Agilent application notes AN1287-3, *Applying Error Correction to Network Analyzer Measurements*, PN 8510-5A, *Specifying Calibration Standards for the Agilent 8510 Network Analyzer*, and AN 1287-9, *In-Fixture Measurement Using Vector Network Analyzers*, all three of which are incorporated herein by reference.

The method 100 of the present invention applies to error correction methodologies or calibration types that employ error models having twelve or more terms. For the purposes of discussion and without loss of generality, an SOLT calibration type that employs a twelve-term error model will be assumed hereinbelow. One skilled in the art may readily extend the discussion herein with respect to the SOLT calibration type to other calibration types related to SOLT without undue experimentation.

As described hereinabove, unlike the conventional calibration types, such as those described in the above-referenced application notes, a calibration standard in the set of calibration standards, need not be a precision device having well-characterized parameters. On the contrary, the method 100 of determining a parameter value according to the present invention explicitly determines one or more parameter values of respective defining parameter(s) of one or more calibration standards in the set. However in some embodiments, at least one calibration standard of the set of standards is a precision standard (i.e., one having known defining parameters). Thus for example, calibration standards that approximate a short, an open, a load, and several standards that approximate a through may be employed as the short, open, load and several thru standards, respectively, of a multiport SOLT according to some embodiments. Moreover in some of these embodiments, the precision or known calibration standard employed is one of the several thru standards. The use of a precision thru standard is chosen in some embodiments since the thru standard is more readily characterizable than the short, open, or load standards using conventional characterization methodologies.

It should be noted that in the example of calibration standards described hereinabove, only one of the thru standards is a precision thru even though there may be as many thru standards as N*(N−1)/2 where N is the number of test ports in the multiport VNA being calibrated. In other embodiments, more than just one precision standard is employed. For example, two precision thru standards out of a total of three precision thru standards may be employed when the multiport VNA is a three-port VNA. Of course, even more precision standards may be employed in some embodiments. For example, all standards except for the short and the open may be precision standards in some embodiments. In general, any or approximately all of the standards may be precision standards according to some embodiments.

An example of when standards may be approximate or non-precision standards is 'in fixture' testing of a DUT. In general, the test fixture serves two principal roles: adapting a standardized interface of the multiport VNA to that of the DUT, and physically/electrically mimicking the mounting environment of the DUT. The test fixture can be as simple or as complex as is required by the test being performed on the DUT. For example, a typical standard interface for the multiport VNA is a set of coaxial cables having one of several standardized connector types on terminating ends. The test fixture can serve as a transition or adaptor between the standardized connectors of the coaxial cables and a non-standard DUT interface (e.g. solder pin or tab). In other situations, the test fixture may provide mounting and power connections as well as serve as an interface adaptor for a DUT lacking standardized connectors. Alternatively, the test fixture may be simply a connector on the end of a cable or a connector adaptor that adapts one connector type to another in a case where the DUT has standardized connectors. The test fixture may even be a 'null' fixture having zero loss, zero electrical length and no parasitics. A DUT that is mounted in a PCB to facilitate measurement using a VNA is equivalent to 'in-fixture' testing. In some embodiments, a high isolation, low common ground inductance fixture is used. An example of such a fixture is described in a co-pending patent application of David A. Feld et al., Ser. No. 10/331,714, filed Dec. 27, 2002, entitled "System and Method for Providing High RF Signal Isolation and Low Common Ground Inductance in an RF Circuit Testing Environment", incorporated herein by reference.

Once again referring to FIG. 1, the method 100 of determining a parameter value further comprises measuring 120 S-parameters of the asymmetric reciprocal device. In particular for a multiport asymmetric reciprocal device, a set of a raw input reflection S-parameter $S_{nn}$, for all n from 1 to N, where N equals a number of ports or input/outputs of the asymmetric reciprocal device, is measured 120 using the multiport VNA. Moreover, a set of raw forward transmission S-parameters $S_{nm}$, and a corresponding set of raw reverse transmission S-parameters $S_{mn}$ are measured 120 using the multiport VNA for all n and m from 1 to N, n not equal to m. In the case of in-fixture testing, the reciprocal device generally fits or is mountable in the test fixture.

The sets of raw S-parameters, $S_{nn}$, $S_{nm}$, and $S_{mn}$, are measured 120 over a range of frequencies that span the frequency range for which a calibration of the multiport VNA is to be performed. As with the measurement 110 of the calibration standards, a number of frequency points over which the S-parameters of the asymmetric reciprocal device is measured 120 is greater than or equal to the number of parameters that are determined 100, in some embodiments. In some of these embodiments, the same frequency points are used for measuring 110 the calibration standards and for measuring 120 the asymmetric reciprocal device. An order in which the sets of raw S-parameters $S_{nn}$, $S_{nm}$, and $S_{mn}$ are measured 120 is unimportant. Moreover, an order in which the calibration standards are measured 110 and the asymmetric reciprocal device is measured 120 is also unimportant with respect to some embodiments of the method 100. Thus, measuring 120 the asymmetric reciprocal device may be performed either prior to or subsequent to measuring 110 the calibration standards.

The method 100 of determining a parameter value further comprises adjusting 130 the parameter value of the defining parameter of the calibration standard in the set of calibration standards. Specifically, adjusting 130 comprises optimizing the parameter value in such a way that a difference (e.g., rms over frequency) between a set of corrected forward transmission S-parameters $S_{nm}$ and a corresponding set of corrected reverse transmission S-parameters $S_{mn}$ for the asymmetric reciprocal device is minimized. The set of corrected forward S-parameters and the corresponding set of reverse S-parameters are the set of raw measured 120 forward S-parameters $S_{nm}$ and the corresponding set of raw measured 120 reverse S-parameters $S_{mn}$ for the asymmetric reciprocal device that have been corrected using an error model of the multiport VNA.

The error model, in turn, employs the parameter value being adjusted 130 along with the measured 110 S-parameters for the calibration standards to determine error coefficients of the error model. The determined error coefficients are used to produce the corrected measured S-parameters from the raw measured 120 S-parameters of the asymmetric reciprocal device. Thus, adjusting 130 the parameter value ultimately adjusts the error coefficients and has an effect on the corrected measured S-parameters of the asymmetric reciprocal device that allows for an assessment of whether or not the forward and reverse transmission S-parameters difference is minimized.

For example, the multiport VNA may employ a so-called 'twelve-term' error model (or more correctly a multiport extension of the twelve-term error model) to correct for systematic errors associated with measurements performed by the multiport VNA. All of the major systematic errors associated with using a multiport VNA to measure S-parameters can be accounted for by six types of errors: directivity and crosstalk related to signal leakage, source and load impedance mismatches related to reflections, and frequency response errors related to reflection and transmission tracking within test receivers of the multiport VNA. Thus for a two-port VNA, measuring S-parameters of a general two-port DUT, there are six forward-error terms and six reverse-error terms for a total of twelve error coefficients or terms (including two terms that combine the various transmission crosstalk terms into a forward crosstalk or a reverse crosstalk term). Such a full measurement calibration for a general two-port DUT is often referred to as a 'twelve-term' error correction or calibration using a twelve-term error model. An extension of the twelve-term error model for a full measurement calibration of a multiport VNA similarly is referred to as a twelve-term error model by those skilled in the art even though such an error model necessarily has more than twelve terms.

Figure 2A:
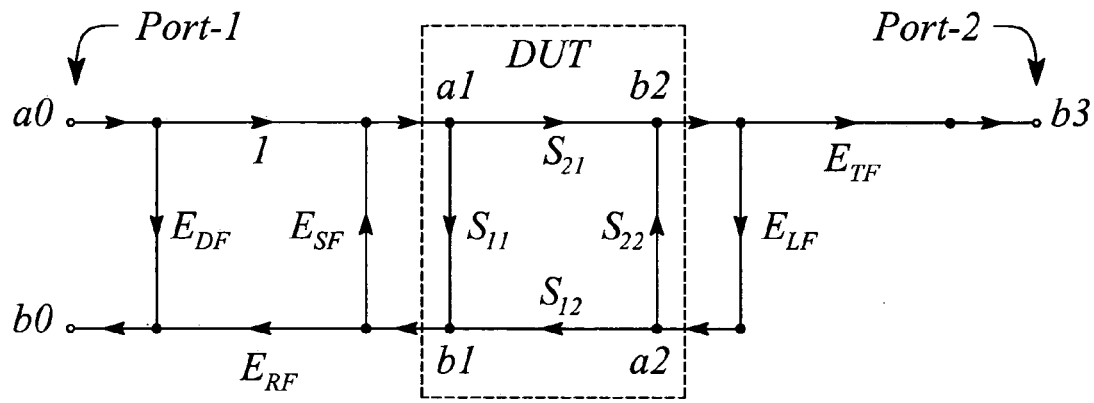
FIG. 2A illustrates a flow graph representation of a conventional forward portion of a twelve-term error model for a two-port VNA.
Figure 2B:
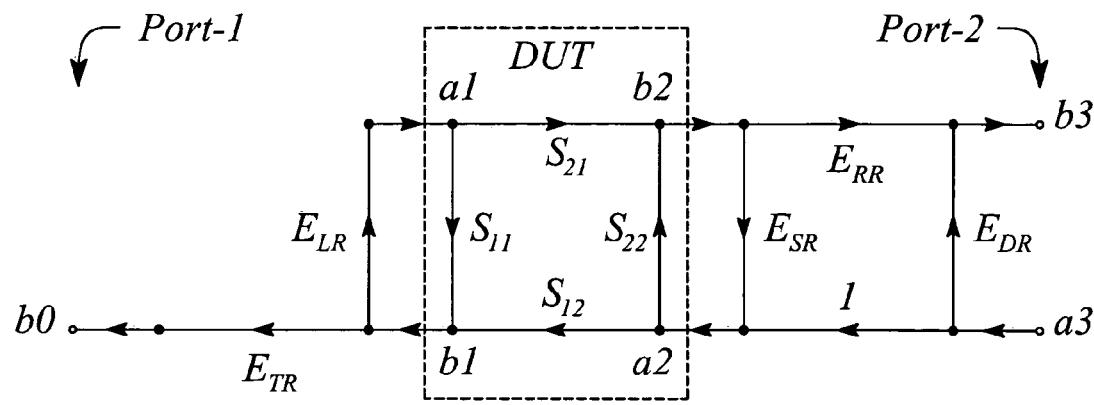
FIG. 2B illustrates a flow graph representation of a conventional reverse portion of the twelve-term error model for a two-port VNA.

FIG. 2A illustrates a flow graph representation of a conventional forward portion of a twelve-term error model for a two-port DUT. FIG. 2B illustrates a flow graph representation of a conventional reverse portion of the twelve-term error model. The error-terms or error coefficients of the twelve-term error model are represented as vertices in the flow graph. Flowgraphs (not illustrated) analogous to those illustrated in FIGS. 2A and 2B may be used to represent extended twelve-term error models for use with DUTs and/or multiport VNAs having more than two ports.

The error model for the multiport VNA employs definitions of the calibration standards in the set associated with calibrating the multiport VNA. The definitions usually comprise values of certain defining parameters of the calibration standards being employed. The parameter values are used in models of the calibration standards in conjunction with measured S-parameters of the calibration standards to extract the error coefficients for the error model. Once the error coefficients are known, the error model may be employed to apply a correction to raw measured S-parameters of a DUT to produce calibrated measured S-parameters for the DUT.

Figure 3:
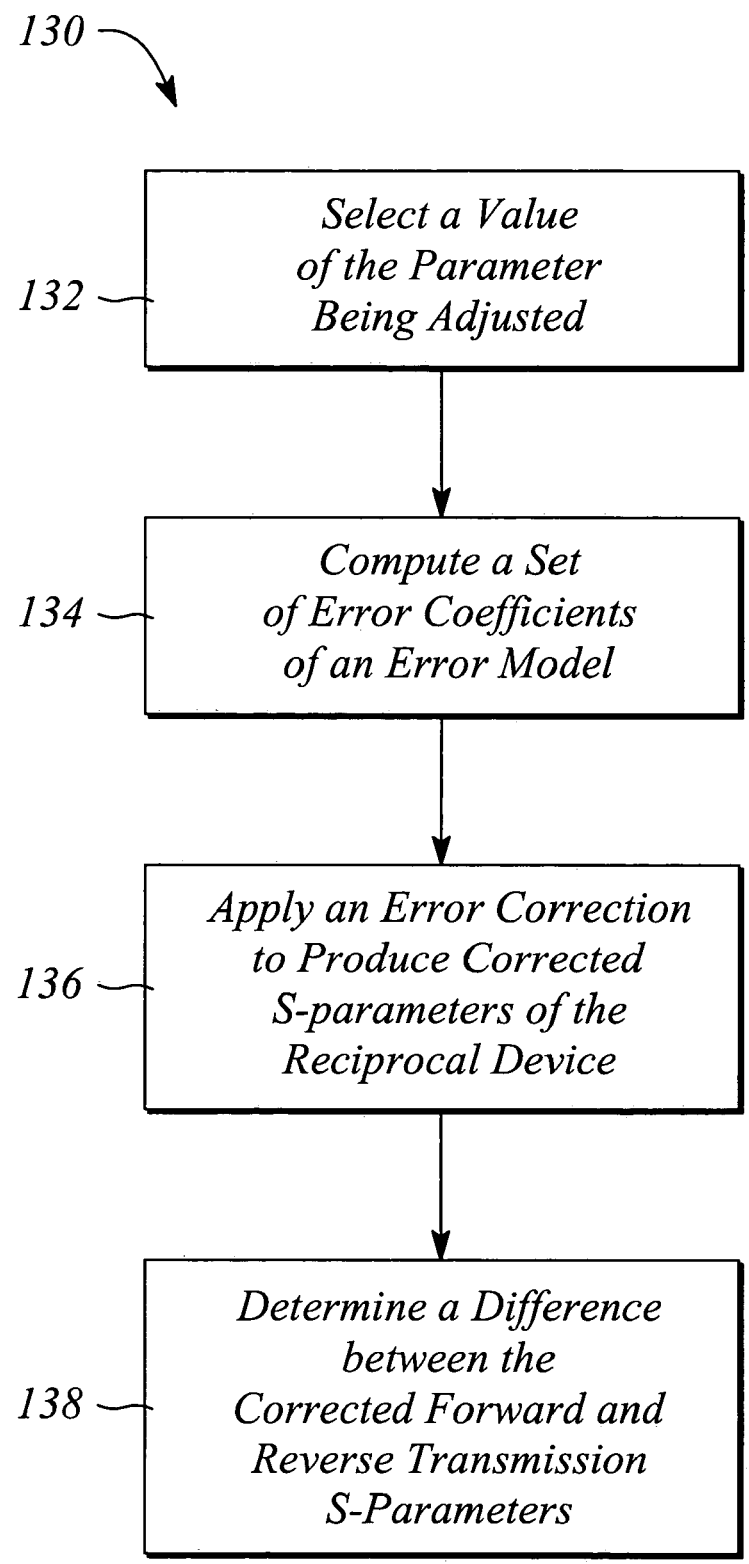
FIG. 3 illustrates a flow chart of an embodiment of adjusting a parameter value according to the method of FIG. 1.

FIG. 3 illustrates a flow chart of an embodiment of adjusting 130 the parameter value according to the method 100 of FIG. 1. Adjusting 130 comprises selecting 132 a value to establish a 'present' value of the parameter value. Adjusting further comprises computing 134 a set of error coefficients. Computing 134 utilizes the measured 110 S-parameters of the set of calibration standards along with the selected 132 present parameter value. Therefore, the computed 134 error coefficients are a function of the selected 132 present parameter value. Adjusting further comprises applying 136 an error correction to the measured 120 sets of raw forward and raw reverse transmission S-parameters, $S_{nm}$ and $S_{mn}$, of the asymmetric reciprocal device using the computed 134 error coefficients and the measured 120 sets of raw S-parameters, $S_{nm}$ and $S_{mn}$. Applying 136 an error correction produces sets of corrected forward and corrected reverse transmission S-parameters, $S_{nm}$ and $S_{mn}$, for the asymmetric reciprocal device.

Adjusting 130 further comprises determining 138 a difference between the set of corrected forward transmission S-parameter $S_{nm}$ and the corresponding set of corrected reverse transmission S-parameter $S_{mn}$. In some embodiments, the difference is determined with respect to or across the frequency range of one or both of the DUT or the calibration. The process of adjusting 130, which includes selecting 132 a value, computing 134 a set of error coefficients, applying 136 an error correction, and determining 138 a difference, is repeated for a next 'present' value that is different from a previous 'present' value, until the difference between the corrected measured forward and reverse transmission S-parameters of the asymmetric reciprocal device is minimized.

As such in some embodiments, adjusting 130 the parameter value according to the method 100 may be viewed equivalently as an iterative optimization of the error coefficients of the error model, the iteration being terminated when the results of the error correction is judged to be satisfactory. A metric, such as the difference between the sets of corrected forward and reverse transmission S-parameters, $S_{nm}$ and $S_{mn}$, of the asymmetric reciprocal device, is used to assess the progress of the optimization. When progress is no longer expected or required, the optimization iterations are discontinued and either a last selected 132 or a previously selected 132 present set of error coefficients or equivalently, a last selected 132 or a previously selected 132 present parameter value or set of parameter values from which the error coefficients are determined, is taken to be an optimized set. The metric (e.g., difference) is employed to decide whether or not to continue iterating.

As discussed hereinabove, the sets of actual forward and reverse transmission S-parameters, $S_{nm}$ and $S_{mn}$, are theoretically equal. Therefore, when the difference between the sets of corrected forward and reverse transmission S-parameters, $S_{nm}$ and $S_{mn}$, of the asymmetric reciprocal device is smaller than a predetermined error value δ, the adjusted 130 parameter value or set of values may be assumed to be optimized and the iterating of the adjustment 130 may be terminated.

Essentially, any number of iterative optimization methodologies or approaches may be used in adjusting 130 the parameter value. Thus, adjusting 130 the parameter value may employ an optimization such as, but not limited to, an exhaustive search, a random search, a conjugate gradient optimization, a Powel's method optimization, or a genetic algorithm optimization. In most cases, well-known iterative optimization methodologies typically differ primarily in a way in which a next value or set of values used by the metric is chosen or selected 132 at a beginning of each iterative cycle. For example, in a random search (aka Monte Carlo) optimization, a selection 132 of a next value or set of values is random. On the other hand, in a gradient-type optimization, a next value or set of values is selected 132 in such a way that a search trajectory is caused to ultimately follow a gradient of an optimization surface defined by the metric. Specifically, it is not the intent of the present invention to be limited in any way by a choice of a specific optimization methodology for adjusting 130 the parameter value.

As described above, a metric involving the sets of corrected measured transmission S-parameters $S_{nm}$ and $S_{mn}$ of the asymmetric reciprocal device is used in conjunction with the optimization inherent in adjusting 130. Virtually any arbitrary metric that assesses and quantifies a difference between the sets of corrected transmission S-parameters, $S_{nm}$ and $S_{mn}$, of the asymmetric reciprocal device may be employed. In particular, a difference between magnitudes and/or phases of the sets of corrected measured transmission S-parameters $S_{nm}$ and $S_{mn}$ may be used as a metric. For example, a useful metric M that employs a sum of a square of a magnitude of a difference between individual sets of corrected measured forward and reverse transmission S-parameters, $S_{nm}$ and $S_{mn}$, is given in equation (1).

$$M = \sum_f |S_{nm} - S_{mn}|^2 \quad (1)$$

As given in equation (1), the summation is taken over a set of frequency points f and the metric M is identically zero (M=0) if and only if the set of corrected measured transmission S-parameter $S_{nm}$ equals the corresponding set of corrected measured transmission S-parameter $S_{mn}$ at all frequency points f. One skilled in the art may readily determine other similar metrics, all of which are within the scope of the various embodiments of the method 100. For example, a root-mean-square metric (rms) and/or a sum of a difference in phase may be employed. In other examples, a combination of more than one metric may be used as the arbitrary metric.

Referring back to FIG. 1, the method 100 of determining may further comprise reporting 140 an optimized parameter value that results from the adjusting 130. As such, the optimized parameter value may be the last selected 132 or the previously selected 132 present parameter value when the iteration of adjusting 130 is terminated. The reported 140 optimized parameter value essentially represents an approximation of a true or a precision value of the parameter. Thus, following the method 100 of determining the parameter value, the set of calibration standards may be employed in place of conventional, precision calibration standards to perform calibrated measurements on a DUT.

To better appreciate the method 100 of determining a parameter value, consider an example of using the method 100 in conjunction with an SOLT calibration of the multiport VNA using a set of calibration standards, in which at least one calibration standard of the set is poorly known. For the example, assume that the multiport VNA has three test ports (i.e., port-1, port-2, and port-3). Moreover, assume that a precision thru standard is available for use as a first $thru_{12}$ and that the set of remaining calibration standards including a second $thru_{13}$, a third $thru_{23}$, an open, a short, and a load, is similarly available.

The defining parameter values for the first $thru_{12}$ are all known while at least one of the defining parameter values of one or more of the second $thru_{13}$, the third $thru_{23}$, the open, the short, and the load calibration standards is either unknown or poorly known. Assume for the purposes of discussion that the second $thru_{13}$ and the third $thru_{23}$ are each modeled as an unknown offset delay. Moreover, assume that the open is modeled as an unknown delay followed by a known shunt capacitance, that the short is modeled as an unknown delay followed by an ideal short circuit (i.e., zero inductance), and that the load is modeled as a fixed delay having an unknown load impedance $Z_{load}$ followed by an ideal termination having a 50 Ohm impedance for this example.

Figure 4A:
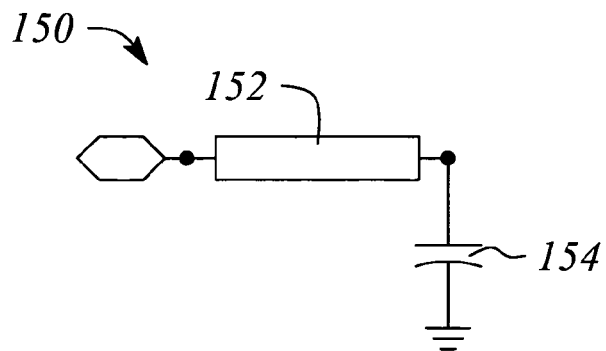
FIG. 4A illustrates a model of an exemplary open calibration standard having an unknown delay in accordance with an embodiment of the present invention.
Figure 4B:
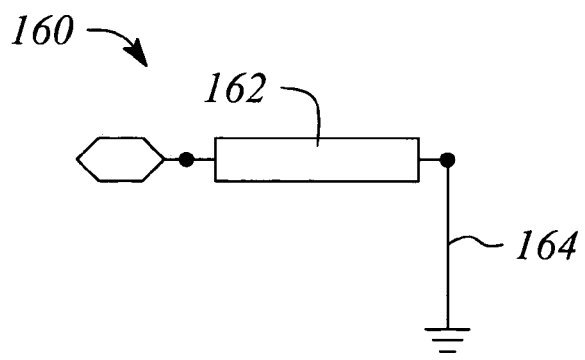
FIG. 4B illustrates a model of an exemplary short calibration standard having an unknown delay in accordance with an embodiment of the present invention.
Figure 4C:
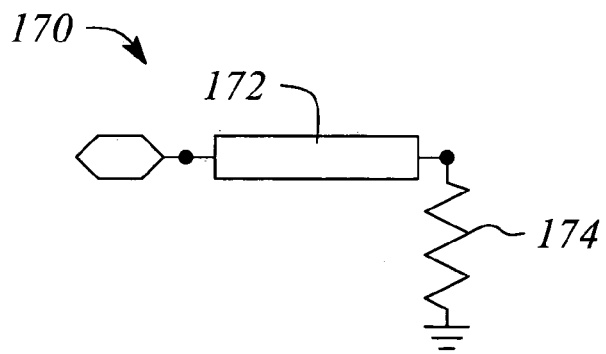
FIG. 4C illustrates a model of an exemplary load calibration standard having a fixed delay and an unknown load impedance in accordance with an embodiment of the present invention.
Figure 4D:
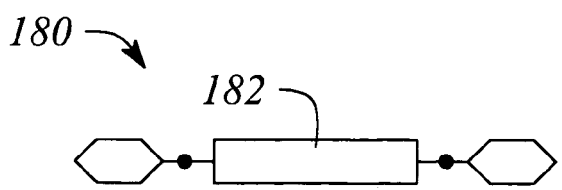
FIG. 4D illustrates a model of an exemplary thru calibration standard in accordance with an embodiment of the present invention.

FIG. 4A illustrates a model of an exemplary open calibration standard 150 having an unknown delay $\Delta_{open}$. As illustrated in FIG. 4A, the exemplary open comprises a delay element 152 connected to a shunt capacitor 154. FIG. 4B illustrates a model of an exemplary short calibration standard 160 having an unknown delay $\Delta_{short}$. As illustrated in FIG. 4B, the exemplary short comprises a delay element 162 connected to a short circuit 164. FIG. 4C illustrates a model of an exemplary load calibration standard 170 having a fixed delay (i.e., known delay) with an unknown load impedance $Z_{load}$. As illustrated in FIG. 4C, the exemplary load comprises a delay element 172 having a known delay length but unknown impedance $Z_{load}$ connected to a 50 ohm termination 174. FIG. 4D illustrates a model of an exemplary thru calibration standard 180. The thru calibration standard 180 may represent of either the second $thru_{13}$ calibration standard or the third $thru_{23}$ calibration standard having an unknown delay $\Delta_{thru}$. As illustrated in FIG. 4D, the exemplary thru comprises a delay element 182 having an unknown electrical length and a known impedance.

Thus for the example, the unknown parameter values are the unknown open delay $\Delta_{open}$, the unknown short delay $\Delta_{short}$, the unknown load impedance $Z_{load}$, the unknown second $thru_{13}$ delay $\Delta_{thru13}$, and the unknown third $thru_{23}$ delay $\Delta_{thru23}$. All other parameters of the calibration standards in the set are known with sufficient precision for calibration purposes, for the example. In particular, an impedance of each of the first, second and third thrus and a delay of the first $thru_{12}$ standard (not illustrated) are known with sufficient precision for calibration purposes. As well, a capacitance $C_0$ of the capacitor 154 of the open in the open standard 150 and the impedance of the termination 174 of the load in the load standard 170 are known with sufficient accuracy to support a calibration of the exemplary three-port VNA. The known parameters may be established through independent measurements or some other technique prior to performing the method 100, for example. Moreover to simplify the example, an inductance of the short in the short standard 160 typically associated with the short circuit 164 is assumed to be zero.

It should be emphasized that minimizing a number of unknowns and applying simplifying assumptions to the models associated with the standards, as has been done for the example, may improve a convergence and/or accuracy of the method 100 of determining a parameter value in some embodiments. However, minimizing the number of unknowns and using simplified models are not required in other embodiments.

Continuing with the example, raw S-parameters are measured 110 for the exemplary first $thru_{12}$, second $thru_{13}$, third $thru_{23}$, short, open, and load standards according to conventional SOLT calibration guidelines and using the exemplary three-port VNA. Similarly, a full set of raw S-parameters, $S_{nn}$, $S_{nm}$, and $S_{mn}$, are measured 120 for a selected asymmetric reciprocal device. In the example, a three-port duplexer is chosen and used as the asymmetric reciprocal device.

Adjusting 130 the parameter values of the unknown parameters in the models of each of the calibration standards 150, 160, 170, 180 then proceeds by selecting 132 an initial value for each of the unknown parameter values $\Delta_{open}$, $\Delta_{short}$, $Z_{load}$, $\Delta_{thru13}$, and $\Delta_{thru23}$. Selection 132 of initial values may be random or may employ an educated guess regarding possible parameter values. For instance, one skilled in the art may be able to determine a relatively close approximate value for the open delay $\Delta_{open}$ from a physical size/length of the open standard 150 being employed. Often, employing an educated guess or otherwise limiting a range of possible values of the unknown parameters during adjusting 130 will result in an improved convergence of the optimization being performed during adjusting 130 the parameter values. An educated guess is used to select the initial values for the present example.

Once selected 132, the models of the calibration standards 150, 160, 170, 180 are used to compute 134 a set of error coefficients for the SOLT calibration with respect to the exemplary three-port VNA. The set of error coefficients is based on a conventional three-port extension of the six forward terms and the six reverse terms consistent with a conventional twelve-term error model of a two-port VNA, previously illustrated in FIGS. 2A and 2B.

An SOLT error correction, using the computed 134 set of error coefficients, is applied 136 to the measured 120 sets of raw forward and reverse transmission S-parameters, $S_{nm}$ and $S_{mn}$ of the asymmetric reciprocal device. The applied 136 error correction produces corrected measured S-parameters from the raw measured S-parameters for the asymmetric reciprocal device. A difference between the set of corrected forward transmission S-parameters $S_{nm}$ and the corresponding set of corrected reverse transmission S-parameters $S_{mn}$ is determined 138. In particular, a metric that quantifies the difference is computed to determine 138 the difference.

Once computed, the metric is compared to a goal. If the goal is achieved, adjusting 130 is terminated, and iteration is not necessary. Otherwise, a new set of parameter values is selected 132 and adjusting 130 continues in an iterative manner.

For the example, the metric is given by equation (1) hereinabove and the goal is for the computed metric M to be less than a predetermined error value δ. Therefore, if the magnitude of the metric M given by equation (1) is less than the predetermined error value δ using a current set of selected 132 parameter values, the goal is deemed to have been achieved and adjusting 130 the parameter values is terminated. If the goal has not been achieved, a new set values for the unknown parameters $\Delta_{open}$, $\Delta_{short}$, $Z_{load}$, $\Delta_{thru13}$, and $\Delta_{thru23}$ are selected 132 and adjusting 130 continues through another iteration with computing 134, applying 136, and determining 138.

As discussed hereinabove, how the new set of values is selected 132 depends explicitly on a type of optimization being employed. For the example, a random search optimization is being performed during adjusting 130 the parameter values. As such, new values for the set of unknown parameters are selected 132 in a random manner.

After the goal has been achieved, a present set of selected 132 parameter values for the unknown parameter values represents an optimized set of parameter values for the calibration standards in the example. The optimized parameter values are optionally reported 140 and the example of the method 100 of determining is concluded. The calibration standards of the example may now be used in a conventional manner to calibrate the exemplary three-port VNA. The above described set of calibration standards are used in a calibration of the exemplary three-port VNA in place of conventional precision standards, since the unknown parameter values are now known as a result of employing the method 100 of determining a parameter value in accordance with the present invention.

Figure 5:
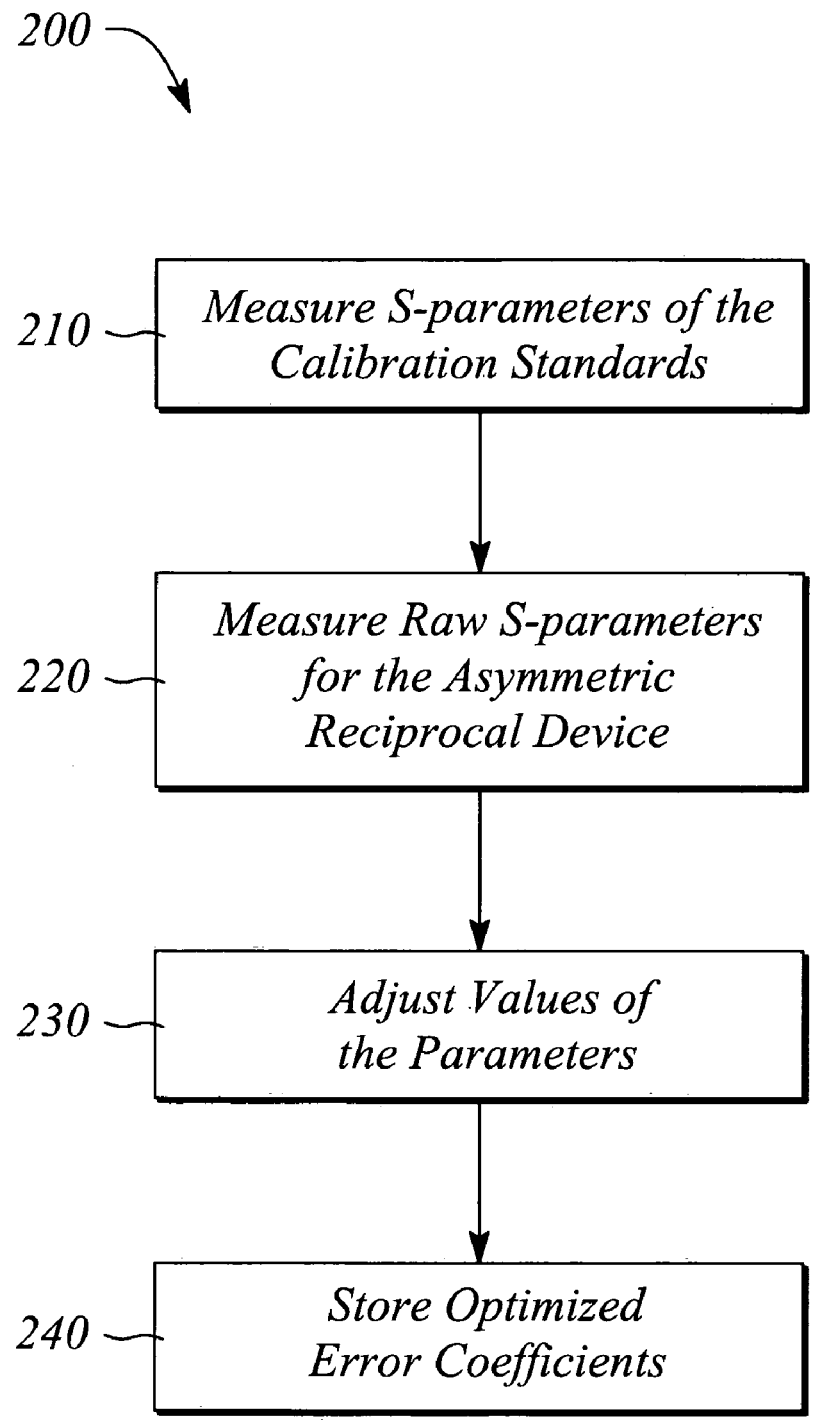
FIG. 5 illustrates a flow chart of a method of compensating a calibration of a multiport vector network analyzer (VNA) using measurements of an asymmetric reciprocal device according to an embodiment of the present invention.

FIG. 5 illustrates a flow chart of a method 200 of compensating a calibration of a multiport VNA using measurements of an asymmetric reciprocal device according to an embodiment of the present invention. A set of error coefficients of an error model for the multiport VNA are optimized by the method 200 to compensate for a parameter value of a defining parameter of a calibration standard in a set of calibration standards used in the calibration that may be 'poorly known' or 'inadequately characterized' or simply desired to be verified. The optimized error coefficients are ones that minimize a metric involving a difference between sets of measured corrected forward and reverse transmission S-parameters, $S_{nm}$ and $S_{mn}$, of an asymmetric reciprocal device wherein the correction employs the error coefficients being optimized.

The method 200 of compensating a calibration comprises measuring 210 S-parameters for a set of calibration standards using the multiport VNA. Preferably, S-parameters for each calibration standard in the set are measured 210. Measuring 210 S-parameters of the standards is essentially the same as measuring 110 S-parameters of the calibration standards described above with respect to method 100 of determining a parameter value.

The method 200 of compensating a calibration further comprises measuring 220 raw S-parameters for an asymmetric reciprocal device using the multiport VNA. Measuring 220 the raw S-parameters of the asymmetric reciprocal device is essentially the same as measuring 120 the raw S-parameters described above with respect to the method 100 of determining a parameter value. Moreover, the asymmetric reciprocal device used in the method 200 of compensating a calibration is essentially the same as the asymmetric reciprocal device described hereinabove with respect to the method 100 of determining a parameter value.

The method 200 of compensating a calibration further comprises adjusting 230 the parameter value of the defining parameter of the calibration standard. Adjusting 230 is essentially the same as adjusting 130 described hereinabove with respect to the method 100 of determining a parameter value. In particular, the parameter value is adjusted 230 to minimize a difference between a set of corrected forward transmission S-parameter $S_{nm}$ and a corresponding set of corrected reverse transmission S-parameter $S_{mn}$ for the asymmetric reciprocal device.

Thus, according to the method 200 and as described hereinabove with respect to the method 100, the sets of corrected forward and reverse transmission S-parameters are the measured forward and reverse transmission S-parameters for the asymmetric reciprocal device corrected using an error model-based error correction of the VNA. The error model employs the parameter value of the calibration standard parameter being adjusted along with the measured 210 S-parameters of the set of calibration standards to generate a set of error coefficients.

The method 200 of compensating further comprises storing 240 an optimized set of error coefficients for the error model. As mentioned above, the set of error coefficients are optimized error coefficients produced from an optimized set of parameter values that result from adjusting 230. After storing 240, the optimized error coefficients may be used to produce calibrated measurements of a DUT using the multiport VNA and further using conventional error correction.

With respect to the example of the method 100 of determining a parameter value described herein above, an example of applying the method 200 of compensating a calibration would be essentially the same except that instead of optionally reporting 140 the optimized parameter values, a set of optimized error coefficients are stored 240. The stored 240 optimized error coefficients are those computed from the present set of parameter values when the goal is achieved, as described above for the method 100 of determining.

Figure 6:
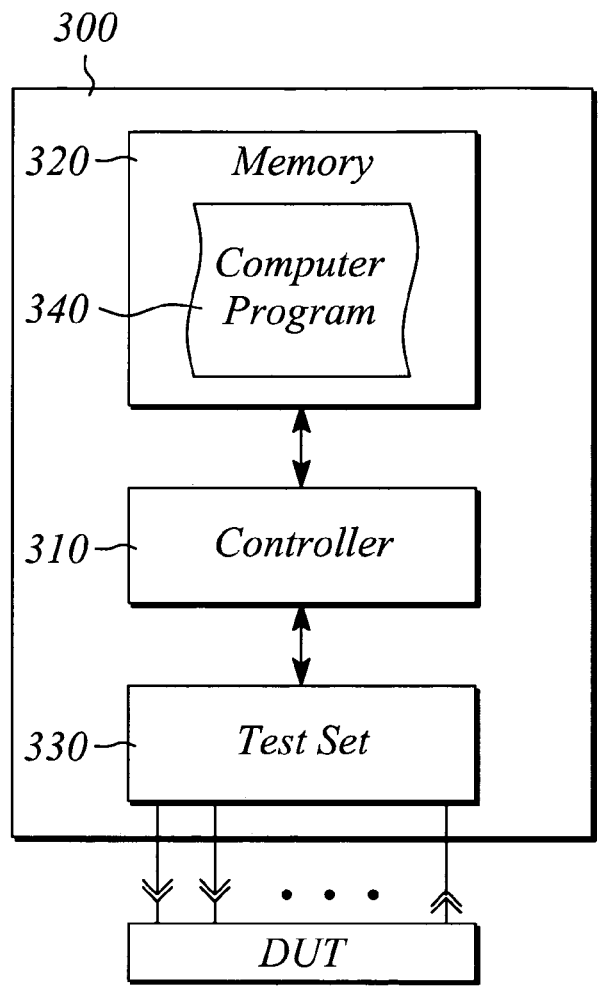
FIG. 6 illustrates a block diagram of a multiport vector network analyzer (VNA) that compensates for inaccuracies in knowledge of calibration standard parameter values used for calibration of the multiport VNA according to an embodiment of the present invention.

FIG. 6 illustrates a block diagram of a multiport vector network analyzer (VNA) 300 according to an embodiment of the present invention. The multiport VNA 300 compensates for inaccuracies in knowledge of a parameter value of a defining parameter for a calibration standard in a set of standards used for calibration of the multiport VNA 300. The inaccuracies are accounted for and the calibration compensated by employing measurements of an asymmetric reciprocal device. As such, the multiport VNA 300 may be calibrated using a set of calibration standards, a parameter value of which is either unknown or poorly known or to be verified. Moreover, the multiport VNA 300 thus compensated may provide calibrated measurements of a multiport device under test (DUT) without the use of a set of precision calibration standards. Additionally, the calibrated measurements may achieve an accuracy level that is consistent with a conventional calibration using precision calibration standards.

The multiport VNA 300 comprises a controller 310, a memory 320, a test set 330, and a computer program 340 stored in the memory 320. The controller 310 controls an operation of the test set 330 by executing instructions of the computer program 340. The controller 310 and the memory 320 may be a conventional microprocessor-based controller and digital memory used in conventional VNAs, for example.

The test set 330 has Ntest ports ($N \geq 3$) that are used to connect to the standards of the set of calibration standards. In addition, the ports are used to either connect to an asymmetric reciprocal device or to a DUT. The test set 330, under direction from the controller 310, measures S-parameters of devices and/or calibration standards connected thereto. The test set 330 may be a conventional N-port S-parameter test set, for example. In some embodiments, the test set 330 is integrated into the multiport VNA 300 as illustrated in FIG. 6. In other embodiments (not illustrated), the test set 330 is a separate element that when combined with a VNA yield the multiport VNA 300.

The computer program 340 comprises instructions that, when executed by the controller 310, facilitate operation of the multiport VNA 300. In some embodiments, the computer program 340 comprises instructions that implement measuring S-parameters for the standards in the set of calibration standards. The computer program 340 further comprises instructions that implement measuring raw S-parameters for an asymmetric reciprocal device. The computer program 340 further comprises instructions that implement adjusting a parameter value of a defining parameter of one or more calibration standards in the set of calibration standards. In some embodiments, the instructions that implement adjusting the defining parameter value perform an iterative adjustment of the parameter value, when desired, until a set of optimized parameter values is determined. The set of optimized parameter values is determined when a metric that assesses a difference between a set of corrected measured forward transmission S-parameters and a corresponding set of reverse transmission S-parameters (e.g., $S_{nm}$ and $S_{mn}$ for a N-port device) of the asymmetric reciprocal device is minimized with respect to a minimization goal. When the minimization goal is achieved, a set of optimized error coefficients is obtained for the multiport VNA 300 that compensate for test system errors.

In some embodiments, the computer program 340 implements the method 200 of compensating a calibration described hereinabove. In other embodiments, the computer program 340 may further comprise instructions that report the optimized parameter values for the set of calibration standards. Using the reported optimized parameter values, the set of calibration standards may be used to calibrate the multiport VNA 300, or any other multiport VNA for that matter, as if the set were precision calibration standards having known parameter values.

Figure 7:
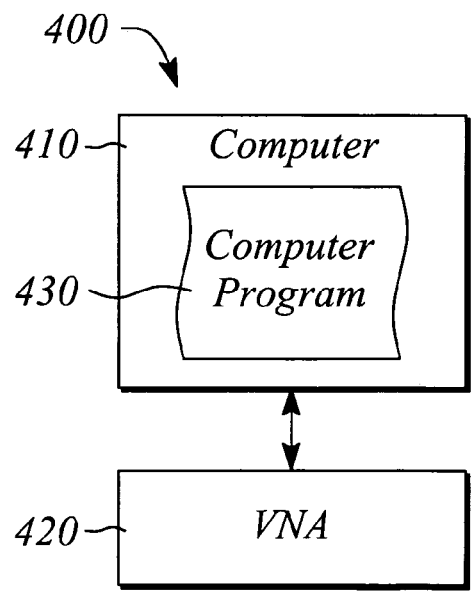
FIG. 7 illustrates a block diagram of a calibration compensation system according to an embodiment of the present invention.

FIG. 7 illustrates a block diagram of a calibration compensation system 400 according to an embodiment of the present invention. The calibration compensation system 400 determines a parameter value of a defining parameter of a calibration standard in a set of calibration standards using measurements of an asymmetric reciprocal device. The determined parameter value is employed to compensate a measurement of the DUT.

The calibration system 400 comprises a computer or controller 410, a multiport vector network analyzer 420, and a computer program 430 stored in a memory of and executed by the computer 410. The computer program 430 comprises instructions that, when executed by the computer 410, control the multiport VNA 420 to determine parameter values for a set of calibration standards. A calibration standard of the set may have one or more unknown or poorly known defining parameter values.

In some embodiments, the computer program 430 comprises instructions that implement measuring S-parameters of the set of calibrations standards using the multiport VNA 420. The computer program 430 further comprises instructions that implement measuring raw S-parameters for an asymmetric reciprocal device using the multiport VNA 420. The computer program 430 further comprises instructions that implement adjusting the parameter values of the defining parameters of the calibration standard set. In some embodiments, the instructions that implement adjusting the parameter values perform an iterative adjustment of the parameter values until a set of optimized parameter values is determined. The set of optimized parameter values is determined when a metric that assesses a difference between a set of corrected measured forward S-parameters, $S_{nm}$, and a corresponding set of reverse transmission S-parameters, $S_{mn}$, of the asymmetric reciprocal device is minimized with respect to a minimization goal. The computer program 430 further comprises instructions that report the set of optimized parameter values.

In some embodiments, the computer program 430 implements the method 100 of determining a parameter value described hereinabove. By employing the optimized parameter values, the set of calibration standards may be used to calibrate the multiport VNA 420. Moreover, the optimized parameter values may be used along with the set of calibration standards to calibrate other multiport VNAs and even two-port VNAs in addition to or instead of the multiport VNA 420. The optimized parameters essentially enable the set of calibration standards to be treated as a set of precision calibration standards.

In other embodiments, the computer program 430 further comprises instructions that implement computing and storing error coefficients of an error model of the multiport VNA 420. In still other embodiments, the computer program 430 implements the method 200 of compensating a calibration described above. In yet other embodiments, the multiport VNA 420 is the multiport VNA 300 described above.

Thus, there has been described various embodiments of the present invention that facilitate the use of calibration standards having poorly known defining parameters by employing an asymmetric reciprocal device. A method of determining a parameter value of a calibration standard in a set of standards and a method of compensated calibration of a multiport VNA have been described. In addition, a multiport VNA having compensated calibration and a calibration compensation system have been described. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of determining a parameter value for a set of calibration standards used to calibrate a multiport vector network analyzer, the method comprising:
   employing measurements of an asymmetric reciprocal device made with the multiport vector network analyzer to optimize a parameter value of a defining parameter of the set of calibration standards.

2. The method of claim 1, wherein the asymmetric reciprocal device has a number of ports greater than or equal to a number of test ports of the multiport vector network analyzer.

3. The method of determining of claim 1, wherein the optimized parameter value minimizes a difference between a set of corrected forward transmission S-parameters and a corresponding set of corrected reverse transmission S-parameters, the difference being computed from the employed measurements of the asymmetric reciprocal device.

4. The method of determining of claim 3, wherein computing the set of corrected forward transmission S-parameters and the corresponding set of reverse transmission S-parameters comprises using the parameter value being optimized; using measurements of the set of calibrations standards; and using an error model of the multiport vector network analyzer.

5. The method of determining of claim 1, wherein employing comprises:
measuring S-parameters of the set of calibration standards;
measuring raw S-parameters of the asymmetric reciprocal device; and
adjusting the parameter value to minimize a difference between a set of corrected forward transmission S-parameters and a corresponding set of corrected reverse transmission S-parameters of the asymmetric reciprocal device.

6. The method of determining of claim 5, wherein the set of corrected forward transmission S-parameters and the corresponding set of reverse transmission S-parameters are computed from the measured raw S-parameters of the asymmetric reciprocal device using an error correction, coefficients of the error correction being computed from the measured S-parameters of the set of calibration standards and the parameter value being adjusted, and wherein the optimized parameter value is the adjusted parameter value when the difference is minimized.

7. The method of determining of claim 5, wherein parameter values for a plurality of defining parameters are optimized and the S-parameters are measured at a plurality of frequencies.

8. The method of determining of claim 1, wherein defining parameters of at least one of standards of the set of calibration standards are known.

9. The method of determining of claim 1, wherein defining parameters of a single thru standard of the set of calibration standards are known.

10. A method of determining a parameter value of a calibration standard in a set of calibration standards used to calibrate a multiport vector network analyzer having more than two test ports, the method comprising:
measuring S-parameters of the set of calibration standards using the multiport vector network analyzer;
measuring raw S-parameters for an asymmetric reciprocal device using the multiport vector network analyzer; and
adjusting the parameter value of the calibration standard until a difference between a set of corrected forward transmission S-parameters and a corresponding set of corrected reverse transmission S-parameters for the asymmetric reciprocal device is minimized.

11. The method of determining of claim 10, wherein the asymmetric reciprocal device has more than two ports.

12. The method of determining of claim 10, wherein the measured S-parameters of the set of calibration standards and with the parameter value are employed to compute error coefficients of an error model for the multiport vector network analyzer, the computed error coefficients being employed to compute the set of corrected forward transmission S-parameters and the corresponding set of corrected reverse transmission S-parameters from the measured raw S-parameters.

13. The method of determining of claim 10, wherein adjusting the parameter value comprises iteratively adjusting to minimize the difference.

14. The method of determining of claim 10, wherein adjusting the parameter value comprises:
selecting a value for the parameter value being adjusted;
computing a set of error coefficients of an error model of the multiport vector network analyzer from the measured S-parameters of the set of calibration standards and using the selected value;
applying an error correction to a set of raw forward transmission S-parameters and a corresponding set of raw reverse transmission S-parameters measured for the asymmetric reciprocal device to produce the corrected forward transmission S-parameter and the corrected reverse transmission S-parameter; and
determining the difference between the set of corrected forward transmission S-parameters and the corresponding set of corrected reverse transmission S-parameters.

15. The method of determining of claim 14, wherein determining the difference comprises computing a metric M given by $$M = \sum_f |S_{nm} - S_{mn}|^2$$

where $S_{nm}$ is the set of forward transmission S-parameter values, $S_{mn}$ is the corresponding set of reverse transmission S-parameter values, and f is a frequency value.

16. The method of determining of claim 10, further comprising one or both of reporting a set of optimized parameter values for the set of calibration standards and storing a set of error coefficients of an error model for the multiport vector network analyzer, wherein the optimized set includes the adjusted parameter value, and wherein the set of error coefficients is computed from the measured S-parameters of the set of calibration standards and the adjusted parameter value.

17. The method of determining of claim 10, further comprising:
performing calibrated measurements on a multiport device under test with the multport vector network analyzer using the set of calibration standards and the adjusted parameter value.

18. A method of compensating a calibration of a multiport vector network analyzer having more than two test ports, the method comprising:
optimizing error coefficients of an error model of the multiport vector network analyzer using measurements of an asymmetric reciprocal device,
wherein the calibration is compensated to minimize effects of a poorly known defining parameter of a set of calibration standards used for the calibration.

19. The method of compensating of claim 18, wherein one or both of the asymmetric reciprocal device is a multiport device having more than two ports and a thru standard of the set of calibration standards is a precision thru standard.

20. The method of compensating of claim 18, wherein optimizing comprises:
measuring S-parameters of the set of calibration standards using the multiport vector network analyzer;
measuring raw S-parameters for the asymmetric reciprocal device using the multiport vector network analyzer;
adjusting a parameter value of the defining parameter to minimize a difference between a set of corrected forward transmission S-parameters and a corresponding set of corrected reverse transmission S-parameters for the asymmetric reciprocal device; and
storing a set of the error coefficients for the error model, the error coefficient set being extracted from an optimized set of parameter values, the optimized set including the adjusted parameter value of the defining parameter.

21. The method of compensating of claim 20, wherein adjusting a parameter value comprises iteratively adjusting the parameter value until a minimization goal for the difference is achieved.

22. The method of compensating of claim 20, wherein adjusting a parameter value comprises:
selecting a value of the parameter value being adjusted;
computing the set of error coefficients of the error model of the multiport vector network analyzer from the measured S-parameters of the set of calibration standards and the selected value;
applying an error correction to a set of raw forward transmission S-parameters and a corresponding set of raw reverse transmission S-parameters measured for the asymmetric reciprocal device to produce the set of corrected forward transmission S-parameters and the corresponding set of corrected reverse transmission S-parameters; and
determining the difference between the set of corrected forward transmission S-parameters and the corresponding set of corrected reverse transmission S-parameters.

23. The method of compensating of claim 18, further comprising:
performing calibrated measurements on a multiport device under test with the multiport vector network analyzer using the optimized error coefficients.

24. A method of compensating a calibration of a multiport vector network analyzer having more than two ports, the method comprising:
measuring S-parameters of a set of calibration standards using the multiport vector network analyzer;
measuring raw S-parameters for an asymmetric reciprocal device using the multiport vector network analyzer; and
adjusting a parameter value of the set of calibration standards to minimize a difference between corrected forward transmission S-parameters and corresponding corrected reverse transmission S-parameters for the asymmetric reciprocal device.

25. The method of compensating of claim 24, wherein defining parameters of a single thru standard of the set of calibration standards are known.

26. The method of compensating of claim 24, further comprising one or more of:
storing a set of error coefficients for an error model, the error coefficient set being extracted from an optimized set of parameter values, the optimized set including the adjusted parameter value of the set of calibration standards;
reporting a set of optimized parameter values for the set of calibration standards, the optimized set including the adjusted parameter value; and
measuring the S-parameters at a plurality of frequencies.

27. The method of compensating of claim 24, wherein adjusting a parameter value comprises:
selecting a value of the parameter value being adjusted;
computing a set of error coefficients for an error model of the multiport vector network analyzer from the measured S-parameters of the set of calibration standards and the selected value;
applying an error correction to a set of raw forward transmission S-parameters and a corresponding set of raw reverse transmission S-parameters measured for the asymmetric reciprocal device to produce the corrected forward transmission S-parameters and the corresponding corrected reverse transmission S-parameters; and
determining the difference between the corrected forward transmission S-parameters and the corresponding corrected reverse transmission S-parameters.

28. A multiport vector network analyzer comprising:
a calibration compensator that compensates for inaccuracies in knowledge of a parameter value of a calibration standard in a set of calibration standards, the set of calibration standards being used to calibrate the multiport vector network analyzer, the calibration compensator comprising a measurement of an asymmetric reciprocal device, the multiport vector network analyzer having more than two ports.

29. A multiport vector network analyzer that compensates for inaccuracies in knowledge of a parameter value of a set of calibration standards, the analyzer comprising:
a computer program stored in a computer readable medium;
wherein the computer program comprises instruction that implement compensating a calibration of the multiport vector network analyzer using measurements of an asymmetric reciprocal device to determine an optimized set of error coefficients for the set of calibration standards, the multiport vector analyzer having more than two ports.

30. The multiport vector network analyzer of claim 29, further comprising:
a test set, the test set comprising the more than two ports, the ports being temporarily connected to a calibration standard of the set of calibration standards and independently temporarily connected to the asymmetric reciprocal device;
a memory that stores the computer program; and
a controller that controls an operation of the test set and executes the computer program.

31. The vector network analyzer of claim 29, wherein the instructions of the computer program comprise:
instructions that implement measuring S-parameters of the set of calibration standards;
instructions that implement measuring raw S-parameters for the asymmetric reciprocal device;
instructions that implement adjusting the parameter value of the set of calibration standards to minimize a difference between a set of corrected forward transmission S-parameters and a corresponding set of corrected reverse transmission S-parameter for the asymmetric reciprocal device, the adjusted parameter value being used to compute the optimized set of error coefficients; and
instructions that implement storing the optimized set of error coefficients.

32. A calibration compensation system comprising:
a computer;
a multiport vector network analyzer having more than two ports; and
a computer program stored in a memory, the computer program being executed by the computer,
wherein the computer program comprises instructions that, when executed by the computer, implement determining a parameter value of a defining parameter of a calibration standard in a set of calibration standards using a measurement of an asymmetric reciprocal device.

33. The calibration compensation system of claim 32, wherein the instructions of the computer program comprise:
instructions that implement measuring S-parameters for the set of calibration standards using the multiport vector network analyzer;
instructions that implement measuring raw S-parameters for the asymmetric reciprocal device using the multiport vector network analyzer;

instructions that implement adjusting the parameter value to minimize a difference between a set of corrected measured forward transmission S-parameters and a corresponding set of corrected reverse transmission S-parameters of the asymmetric reciprocal device; and instructions that implement reporting an optimized parameter value, the optimized parameter value being the adjusted parameter value for the calibration standard.

34. The calibration compensation system of claim 32, wherein the instructions of the computer program further comprises instructions that implement computing and storing an error coefficient for an error model used by the multiport vector network analyzer, the error coefficient being computed from an optimized parameter value for the defining parameter of the calibration standard.

35. The calibration system of claim 33, wherein the set of calibration standards comprises a precision thru standard, the parameter value being adjusted being a value of a defining parameter for a standard of the set other than the precision thru standard.

* * * * *